Feb. 20, 1968 H. P. BROWER ETAL 3,370,255

FM SYSTEM USING CRYSTAL OSCILLATOR

Filed Oct. 18, 1965 3 Sheets-Sheet 1

INVENTORS
HARLEY P. BROWER
DARRELL F. HENNESSEY
BY
Moody and Phillion
ATTORNEYS

FM SYSTEM USING CRYSTAL OSCILLATOR

Filed Oct. 18, 1965 3 Sheets-Sheet 2

INVENTORS
HARLEY P. BROWER
DARRELL F. HENNESSEY
BY
Moody and Phillion
ATTORNEYS

INVENTORS
HARLEY P. BROWER
DARRELL F. HENNESSEY
BY
Moody and Phillion
ATTORNEYS

United States Patent Office
3,370,255
Patented Feb. 20, 1968

3,370,255

FM SYSTEM USING CRYSTAL OSCILLATOR

Harley P. Brower, Cedar Rapids, and Darrell F. Hennessey, Marion, Iowa, assignors to Collins Radio Company, Cedar Rapids, Iowa, a corporation of Iowa Filed Oct. 18, 1965, Ser. No. 497,393
8 Claims. (Cl. 332—26)

ABSTRACT OF THE DISCLOSURE

A crystal-controlled frequency modulator oscillator having a greater frequency swing from the nominal center frequency than obtainable by prior art circuits. The circuit includes, in series arrangement, an electron valve, a crystal, a tuned circuit loading means, variable capacitive means and inductive means. The overall reactance of the tuned circuit loading means, the inductive means, and the variable capacitive means, at the nominal center frequency is inductive in nature and equal to $X_L$. To maintain oscillation the crystal must operate below its series resonant frequency in the capacitive reactance operating portion of its response curve and, at nominal center frequency, must have a capacitive reactance $X_C=X_L$. The variable capacitor is coupled to the main series circuit through a step-up transformer in order to effectively pull the frequency of the relatively large reactance crystal.

This invention relates generally to circuit means for frequency modulating a crystal-controlled oscillator and, more particularly, it relates to a more reliable circuit for frequency modulating a crystal-controlled oscillator over a linear frequency range wider than obtainable with prior art devices.

In prior frequency modulating circuits employing crystals, one of the more serious problems presented is the large amount of reactance required to pull the crystal frequency off its natural resonance. This difficulty is due, primarily, to the large reactance inherent in most crystals.

An additional problem associated with frequency modulation circuits employing crystals stems from the relative proximity of the series resonant frequency of the crystals to the antiresonant frequency of said crystal. Since the frequency response curve near the antiresonant frequency is quite nonlinear, the maximum variation of frequency from a nominal center frequency of series resonance is quite limited.

In the prior art the first of the above two problems has been solved by coupling the crystal to the main oscillator circuit through a step-down transformer. The step-down transformer steps down the crystal impedance presented to the main circuit by the turns ratio of the transformer windings. Thus less reactance in the main circuit is required to pull the crystal frequency off its nominal resonant frequency.

While the aforementioned prior art structure solves the problem presented by the high impedance of the crystal, a new problem is created by the crystal frequency being affected by unwanted impedance changes in the main circuit. More specifically, while the step-down transformer decreases the impedance of the crystal, as presented to the main circuit, any changes in impedance occurring in the main circuit will be increased by the transformer, as seen by the crystal. Thus, the operating frequency of the crystal will be affected not only by some variable impedance means, specifically employed for that purpose, such as a variable capacitor, but will also be affected by other, undesirable changes in impedance, such as for example, an impedance change in a transistor due to a change in temperature. Any other components in the main circuit which undergo impedance changes will also produce some effect upon the operating frequency of the crystal, magnified by the turns ratio of the coupling transformer.

In effect, the coupling of the crystal to the main circuit by a step-down transformer results in a decrease in the slope of the frequency response curve of the crystal with changes in impedance in the main circuit, including those changes in the variable reactance employed specifically to produce the frequency modulation effect.

An object of the present invention is to provide a frequency modulating circuit employing a crystal oscillator in which the problem presented by the inherent large impedance of a crystal oscillator is removed, but in which the operating frequency of the crystal oscillator is not appreciably adversely effected by unwanted impedance changes in the circuit.

Another object of the invention is to provide a frequency modulation circuit employing a crystal in which the crystal is connected directly in the main circuit and not through a step-down transformer means.

A third object of the invention is a frequency modulating circuit employing a crystal in which the crystal is connected directly in the main circuit and in which the variable reactance is coupled to the main circuit through a step-up transformer means.

A fourth object of the invention is a frequency modulating circuit having a greater frequency swing from the nominal center frequency than obtainable by prior art circuits.

Another object of the invention is the improvement of frequency modulated circuits employing crystal oscillators, generally.

In accordance with the invention, there is provided a circuit comprising, in series arrangement, a crystal means, a driving means, a tuned circuit loading means, variable capacitive means and first inductive means. The circuit is designed so that the overall reactance of the tuned circuit loading means, the driving means, the first inductive means, and the variable capacitive means, when said variable capacitive means is at its nominal center setting, is inductive in nature. Thus, to balance the capacitive and inductive reactances, the nominal center frequency of the crystal must be below its point of series resonant frequency in the capacitive reactance operating portion of its response curve. Thus the maximum frequency swing of the crystal, before entering the nonlinear area of operation near the antiresonance of the crystal frequency response, is increased. In accordance with the feature of the invention, the variable capacitance, which functions to control the frequency of the modulating function, is coupled to the main series circuit through a step-up transformer. Thus, a relative small capacitive reactance can present a large capacitive reactance to the crystal and is able to effectively pull the crystal frequency either up or down.

In accordance with another feature of the invention, a second inductor is connected across the crystal to produce increased linearity of the frequency response curve of the circuit.

In accordance with still another feature of the invention, a suitable compensating device can be employed to compensate for changes in characteristics of the variable capacitor due to environmental changes, such as temperature, for example.

The above-mentioned and other features and objects of the invention will be more fully understood from the following detailed description thereof when read in conjunction with the drawings in which.

Figures 6, 6A, 7, 7A, 8, 8A:
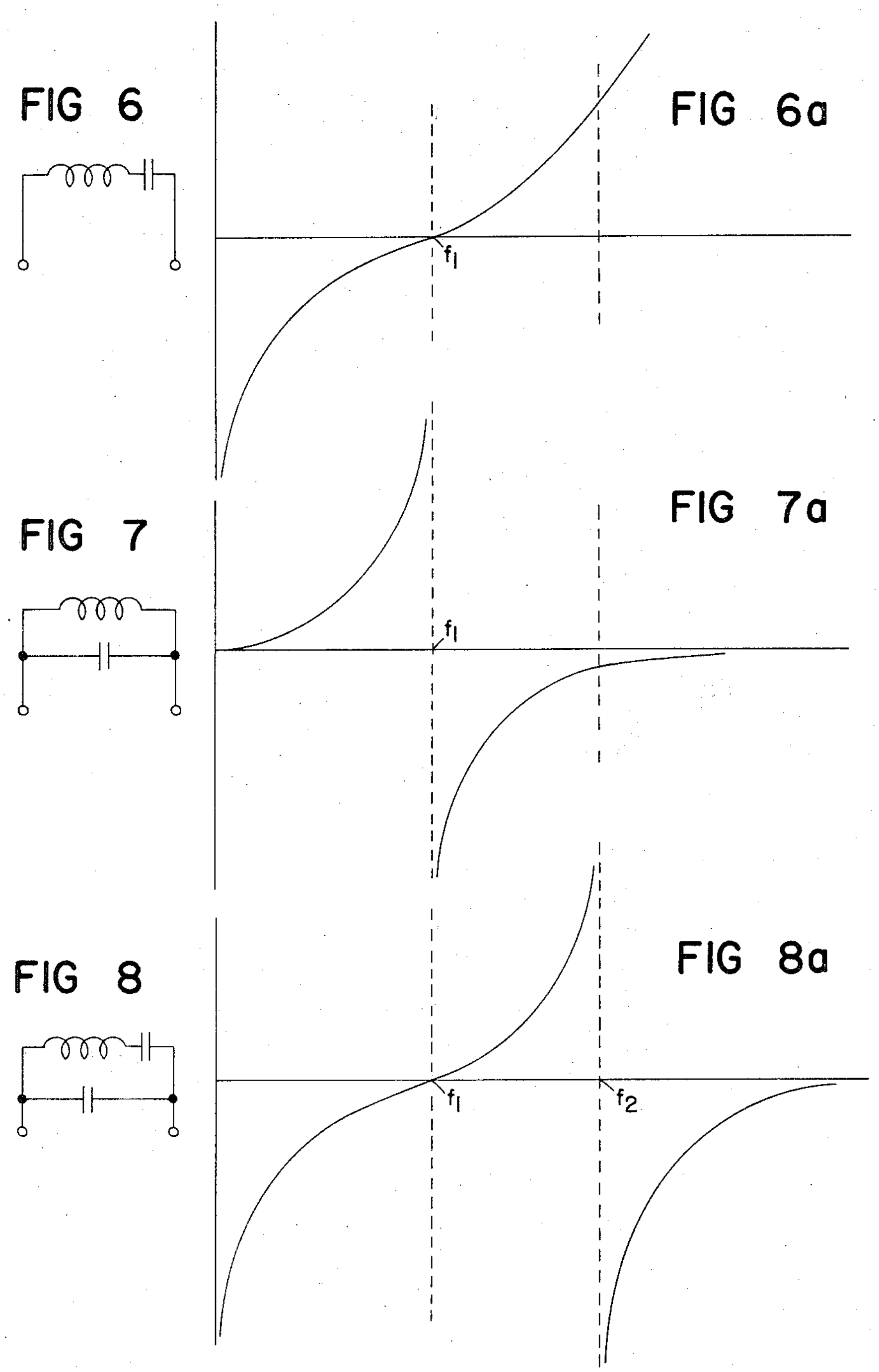

FIGS. 6, 6*a*, 7 and 7*a* show the frequency response curves of a series resonant and a parallel resonant circuit; and FIGS. 8 and 8*a* show the frequency response characteristics of the equivalent circuit of a crystal.

Figure 1:
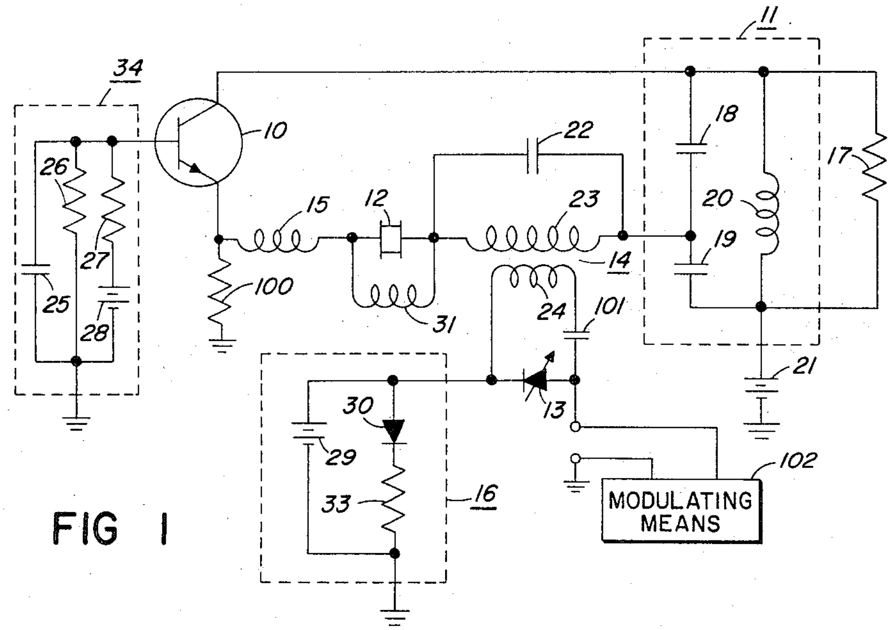
FIG. 1 is a schematic diagram of the circuit.

Referring now to FIG. 1, there is shown a schematic diagram of the invention. In FIG. 1 the main elements of the circuit comprise an amplifying means such as transistor 10, a tank circuit 11, a crystal 12 and a variable capacitor means 13, which is coupled to the main circuit through step-up transformer 14. Battery source 21 provides power to the system and has a return path through resistor 100. Means for modulating the signal generated in the circuit is provided by modulating means 102.

An inductor 31 is connected in parallel with crystal 12, so that the equivalent circuit of crystals 12 and inductor 31 in parallel therewith consists of a parallel circuit and a series cricuit, which two circuits are connected in parallel arrangement. The specific reasons for providing the inductor 31 in parallel with the crystal 12 will be discussed later. Generally, such circuit means functions to increase the linearity of the frequency response curve of the circuit including crystal 12 and inductor 31.

The function of inductor 15, generally, is to move the nominal center frequency of the circuit towards the center of the linear area of the operating characteristic of the circuit. Such function also will be discussed in detail later.

Since a variable capacitor, such as variable capacitor 13, might have some nonlinearity of operation due to environmental characteristics, primarily those of temperature, a means for compensating for temperature-induced distortion is provided. Such means can be a diode 30, having a positive temperature characteristic as does the voltage variable capactor 13. Thus, as temperature increases and the impedance of voltage variable capacitor 13 decreases, the impedance of the diode 30 also decreases and diverts the additional current flowing through voltage variable capacitor 13 through resistor 33 ground. The diode 30, which can be a silicon type diode, is forward-biased by battery 29 so that there is always some current flowing therethrough; the amount of such biasing current varying with temperature.

Alternatively, voltage variable capacitor 13 can be compensated by means of a temperature compensating capacitor 22 connected in parallel with the secondary 23 of the transformer 14. It is to be noted that it is not necessary to employ both capacitor 22 and the circuit within block 13 as compensating means; either one by itself is sufficient.

The circuit within dotted block 34, comprising capacitor 25, resistor 26, resistor 27, and battery source 28, functions to provide biasing for the base of transistor 10.

The operation of the circuit of FIGURE 1 is best described, perhaps, in terms of the impedance-frequency response curves of various portions thereof. For example, the crystal 12 has an equivalent circuit, as shown in FIGURE 8, and a frequency response curve, as shown in FIGURE 8*a*. The frequency $f_1$ is the nautral series resonant frequency of crystal 12 and the frequency $f_2$ is the antiresonant frequency of said crystal. In the particular embodiment of the invention shown in FIGURE 1, the load circuit 11 is tuned to resonant frequency $f_1$. It will become apparent as the description of the circuit continues, that it is not necessary to tune tank circuit 11 precisely to frequency $f_1$.

Figures 3, 4, 5:
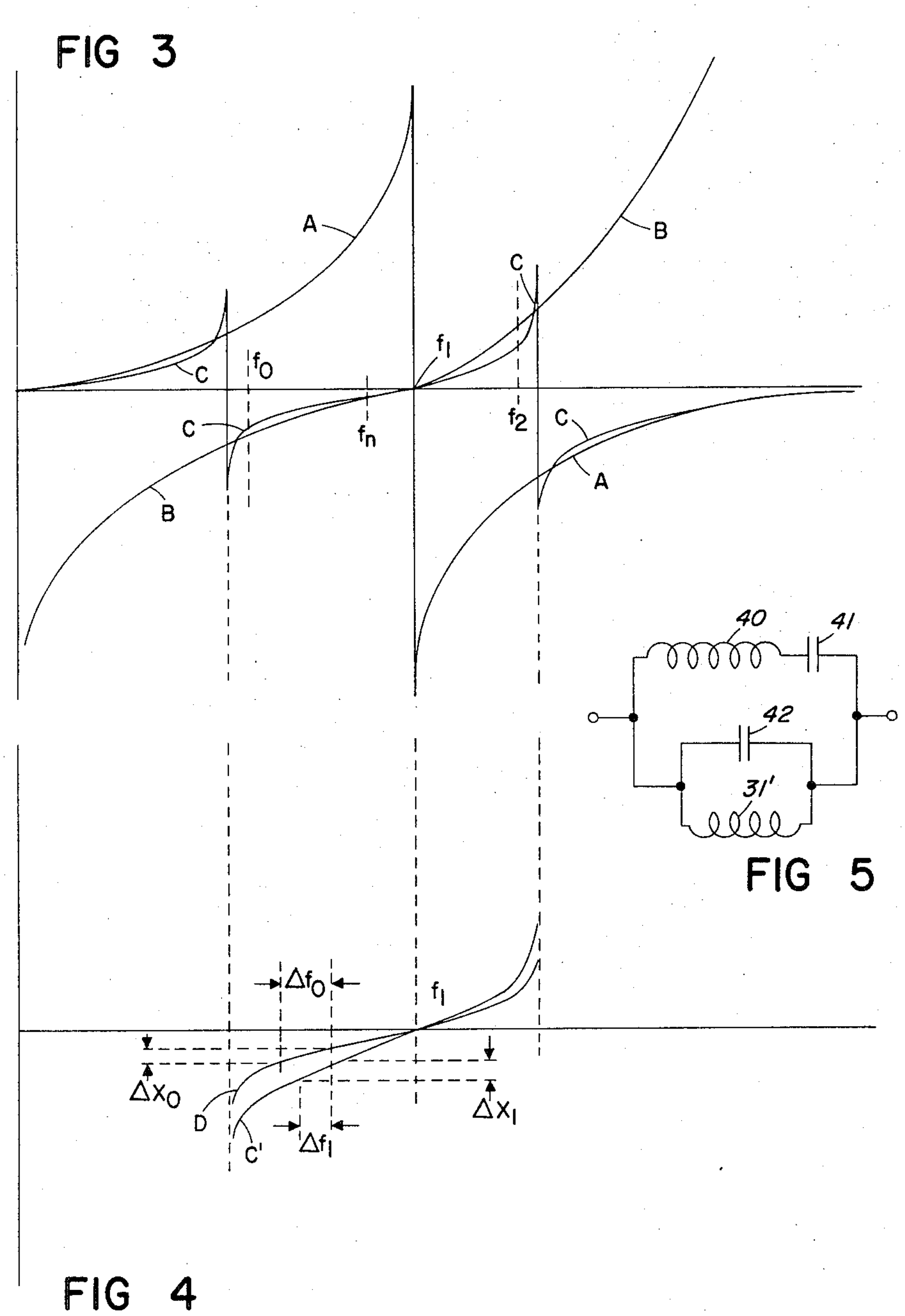
FIG. 3 is a set of frequency response curves of a parallel-tuned circuit connected in parallel with a series-tuned circuit; which constitutes the equivalent of a crystal with an inductor in parallel therewith.
FIG. 4 shows the relative slopes of the frequency response curves of prior art devices and the present invention.
FIG. 5 is the equivalent circuit of the crystal with an inductor in parallel therewith.

When inductor 31 is connected in parallel with crystal 12, an equivalent circuit as shown in FIG. 5 results. Such equivalent circuit consists of a series-tuned circuit in parallel with a parallel-tuned circuit. The series-tuned circuit is comprised of inductor 40 and capacitor 41, and the parallel circuit is comprised of capacitor 42 and inductor 31'.

The impedance vs. frequency characteristic curve of the circuit of FIG. 5 is shown in FIG. 3, along with the impedance vs. frequency characteristic curves of the parallel-tuned branch of the circuit and the series-tuned branch of the circuit of FIG. 5. More specifically, curve A of FIG. 3 represents the frequency response curve of the parallel-tuned circuit, comprising capacitor 42 and inductor 31' of FIG. 5, and the curve B of FIG. 3 represents the frequency response curve of the series-tuned circuit. The curve C represents the composite of curves A and B. Reference is made to FIGS. 6, 6*a*, 7, and 7*a* which show, individually, the impedance vs. frequency response curves of a series-tuned and a parallel-tuned circuit, respectively.

In the structure of FIG. 5, the value of inductor 31' is selected so that the antiresonant frequency of the parallel-tuned circuit, comprised of capacitor 42 and inductor 31', is substantially the same as the resonant frequency of the series-tuned circuit comprised of inductor 40 and capacitor 41. This frequency is designated as $f_1$ in FIGS. 3, 4, 6, and 7. As stated above, the overall resultant impedance vs. frequency characteristic of the circuit of FIG. 5 is represented by the curve C of FIG. 3. It will be noted that curve C is more linear than curve B between the frequency ranges $f_o$ and $f_2$. This increase in linearity is due to the opposing curvature characteristics of curves B and A. For example, between the frequencies $f_o$ and $f_1$, the curve A has an increasing positive slope, whereas the curve B has a decreasing positive slope. The two curves combined tend to form a more linear slope than the curve B alone. Similarly, between the frequencies $f_1$ and $f_2$, the curvatures of the slopes of curves B and A are opposite, with the slope of the curve B increasing and positive and the slope of curve A decreasing and positive. The resulting slope of curve C is more linear than the slope of curve B alone, in the frequency range $f_1$–$f_2$.

From FIG. 3 it can be seen that if the nominal center frequency of the frequency modulating circuit is $f_1$, then the maximum frequency swing is limited at the upper end by the nonlinear area of curve C as it approaches the antiresonant condition. However, there is a much larger possible frequency swing below $f_1$.

To take advantage of the full length of the linear area of curve C, it is necessary to move the nominal center operating frequency from $f_1$ down to a frequency such as frequency $f_n$ in FIG. 3. This is accomplished by the present invention in the following manner.

In FIG. 1 the frequency of the circuit is modulated by changing the reactance of variable capacitor 13. The variable capacitor 13, however, introduces a capacitive reactance into the circuit, which capacitive reactance is compensated for by the addition of an inductance, such as inductor 15.

Since tuned circuit 11 is tuned to the natural resonant frequency $f_1$ of crystal 12, the reactance of inductor 15 would have to be equal to the reactance introduced by vari-cap 13 at frequency $f_1$ in order to maintain the nominal center frequency $f_1$ of the overall circuit. However, by making the inductive reactance created by inductor 15 larger than the capacitive reactance of vari-cap 13, a resultant overall circuit reactance is obtained which is inductive in nature at frequency $f_1$.

Consequently, in order for a resonant condition to exist, the crystal 12 must operate in its capacitive area to an extent necessary to compensate for the excess inductive reactance of the circuit. The value of inductor 15 is selected so that when the crystal operates at the frequency $f_n$, it will be just sufficiently capacitive in nature to overcome the excess inductive reactance in the circuit so that the overall resonant frequency of the circuit is at $f_n$, which, as stated above, is near the center of the linear portion of curve C.

Figure 2:
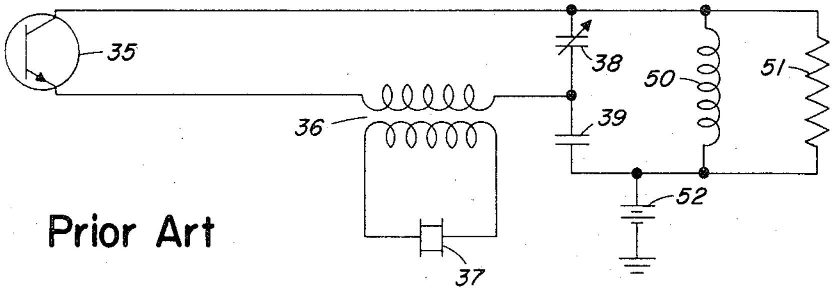
Prior Art FIG 2
FIG. 2 is a simplified schematic diagram of the prior art structure.

In FIG. 4 there is shown a redrawing of curve C of FIG. 3, plus another curve designated as curve D. The curve D represents the relative slope of the impedance vs. frequency response curves of the prior art method of employing a crystal in a frequency modulating system, such as is shown generally in FIGURE 2. In FIGURE 2 the crystal is coupled into the main circuit via a step-down transformer 36. As stated above, the reason for coupling the crystal to the main circuit through a step-down transformer is to step-down the crystal impedance. Ordinarily, crystal impedance is so high that it is expensive to build a circuit in which the variable capacitance is large enough to pull the crystal frequency over relatively large frequency deviations.

The principal disadvantage of the transformer-coupled crystal of FIG. 2 is that any undesirable change in impedance in the main circuit will be magnified by the transformer and affect crystal frequency.

Thus, an impedance change, caused by temperature in transistor 35 for example, will be reflected through transformer 36 and function to produce an appreciable pulling effect on crystal 37. Since a change in impedance through a transformer is proportional to the square of the turns ratio, the impedance through transformer 36 would be increased by a factor of 16 if the transformer turns ratio were four.

In effect then, any change in impedance in the main circuit of FIG. 2 is going to produce a larger frequency change in the operating frequency of crystal 37 than would occur with a corresponding change in the circuit of FIG. 1. Consequently, the impedance frequency response curve for the circuit of FIG. 2 has a smaller slope than that of curve C′ which is the frequency response characteristic of FIG. 1.

As an example of the foregoing, assume that an impedance change $\Delta X_0$ occurs in transistor 35 of FIG. 2. Such incremental change of impedance will cause a change of frequency $\Delta f_0$ in the circuit of FIG. 2, as shown by curve D of FIG. 4. On the other hand, an incremental change of impedance, $\Delta X_1$ which will be assumed to be the same magnitude as $\Delta X_0$, will produce a change of frequency $\Delta f_1$ in the circuit of FIG. 1, as shown by the curve C′ of FIG. 4. It is apparent then, that the operating frequency of the circuit of FIG. 1 is much less sensitive to changes caused by temperature or other environmental conditions, than is the structure of FIG. 2.

The voltage variable capacitor 13 is to some extent sensitive to environmental changes, such as temperature. Such changes, which are undesirable, will be reflected through step-up transformer 14 to crystal 12 to produce undesirable pulling of the operating frequency of crystal 12. However, only one element is involved, namely, the voltage variable capacitor 13, and such undesirable changes in reactance can be controlled quite easily by one of two methods, as discussed above. Specifically, a diode 30 having the same type temperature change characteristic as voltage variable capacitor 13 can be employed as shown in FIG. 1, or, alternatively, a temperature compensating capacitor 22 may be used.

It is to be understood that the form of the invention shown and described herein is but a preferred embodiment thereof and that various changes may be made in circuit arrangement without departing from the spirit or the scope of the invention.

We claim:

1. A frequency modulated crystal-controlled oscillator comprising:

electron valve means having an electron emitting electrode, an electron collecting electrode, and an electron control electrode;

load means including first tuned circuit means connected across said electron emitting electrode and said electron collecting electrode;

feedback circuit means connected between said load means and an electrode of said electron valve means to form an oscillator circuit;

said feedback circuit means comprising in series arrangement;

crystal means having a series resonant frequency $f_1$ and having capacitive reactance $X_C$ when operating at a frequency $f_n$, where $f_n$ is the midpoint of the substantially linear portion of the frequency response curve of said crystal means;

variable capacitive reactance means;

inductive means;

the total reactance, at frequencies $f_n$ and $f_1$, of said load means, said variable capacitive means at its nominal center value, and said inductive means, being inductive in nature and, at frequency $f_n$, having a value of $X_L$, where $X_L=X_C$.

2. A frequency modulating circuit in accordance with claim 1 in which said variable capacitive reactance means comprises:

a variable capacitive means;

and step-up transformer means coupling said variable capacitive means into said series arrangement.

3. A frequency modulating circuit in accordance with claim 2 in which said variable capacitive reactance means further comprises:

compensating circuit means for compensating for changes in the value of said variable capacitive means due to temperature changes;

said compensating circuit means comprising resistive means having a temperature coefficient of a polarity opposite to that of said variable capacitive means and connected across said variable capacitive means;

the characteristics of said resistive means being selected to produce a change in current therethrough, due to a given temperature change, substantially equal to a change in current through said variable capacitive means due to said given temperature change.

4. A frequency modulating circuit in accordance with claim 2 in which said variable capacitive reactance means further comprises:

compensating circuit means for compensating for changes in the value of said variable capacitive means due to temperature changes;

said compensatory circuit comprising second capacitive means having a temperature coefficient of change of a polarity the same as that of said variable capacitive means;

the characteristics of said second capacitive means being selected to produce a change in current therethrough, due to a given temperature change, substantially equal to the change in current through said variable capacitive means due to said given temperature change.

5. A frequency modulated crystal-controlled oscillator comprising:

electron valve means having an electron emitting electrode, an electron collecting electrode, and an electron control electrode;

load means including first tuned circuit means connected across said electron emitting electrode and said electron collecting electrode;

feedback circuit means connected between said load means and an electrode of said electron valve means to form an oscillator circuit;

said feedback circuit means comprising in series arrangement;

crystal means having a series resonant frequency of $f_1$ and having a capacitive reactance $X_C$ when operating at a frequency $f_n$, where $f_n$ is near the center of the substantially linear portion of the frequency response curve of said crystal means;
variable capacitive means;
inductive means;
the total reactance, at frequencies $f_n$ and $f_1$, of said variable capacitive means at its nominal center value, and said inductive means, being inductive in nature and, at frequency $f_n$, having a value of $X_L$ where $X_L = X_C$.

6. A frequency modulating circuit in accordance with claim 5 in which said variable capacitive reactance means comprises:
a variable capacitor;
and step-up transformer means coupling said variable capacitor into said series arrangement.

7. A frequency modulating circuit in accordance with claim 6 in which said variable capacitive reactance means further comprises:
compensating circuit means for compensating for changes in the value of said variable capacitor means due to temperature changes;
said compensating circuit means comprising resistor means having a temperature coefficient of a polarity opposite to that of said variable capacitor means and connected across said variable capacitor means;
the characteristics of said resistor means being selected to produce a change in current therethrough, due to a given temperature change, substantially equal to a change in current through said variable capacitor means due to said given temperature change.

8. A frequency modulating circuit in accordance with claim 6 in which said variable capacitive reactance means further comprises:
compensating circuit means for compensating for changes in the value of said variable capacitor means due to temperature changes;
said compensatory circuit comprising second capacitive means having a temperature coefficient of change of a polarity the same as that of said variable capacitive means;
the characteristics of said second capacitive means being selected to produce a change in current therethrough, due to a given temperature change, substantially equal to the change in current through said variable capacitive means due to said given temperature change.

References Cited

UNITED STATES PATENTS

| | | | |
|---|---|---|---|
| 2,925,561 | 2/1960 | MacDonald | 332—26 |
| 3,007,118 | 10/1961 | Steel | 331—164 |
| 3,068,427 | 12/1962 | Weinberg | 331—158 |
| 3,302,138 | 1/1967 | Brown et al. | 331—116 |

JOHN KOMINSKI, *Primary Examiner.*